(12) United States Patent
Beer

(10) Patent No.: US 7,080,297 B2
(45) Date of Patent: Jul. 18, 2006

(54) MEMORY CIRCUIT AND METHOD FOR READING OUT DATA

(75) Inventor: Peter Beer, Tutzing (DE)

(73) Assignee: Infineon Technologies AG, Munich (DE)

( * ) Notice: Subject to any disclaimer, the term of this patent is extended or adjusted under 35 U.S.C. 154(b) by 444 days.

(21) Appl. No.: 10/676,596

(22) Filed: Oct. 1, 2003

(65) Prior Publication Data

US 2004/0064768 A1   Apr. 1, 2004

(30) Foreign Application Priority Data

Oct. 1, 2002   (DE) ............................... 102 45 696

(51) Int. Cl.
*G11C 29/00* (2006.01)

(52) U.S. Cl. ...................................... 714/719; 714/721
(58) Field of Classification Search ........... 365/230.06, 365/49, 201; 714/718, 154, 719, 721
See application file for complete search history.

(56) References Cited

U.S. PATENT DOCUMENTS

| | | | | |
|---|---|---|---|---|
| 5,901,105 A | * | 5/1999 | Ong et al. ............. | 365/230.06 |
| 5,936,975 A | | 8/1999 | Okamura .................... | 714/719 |
| 6,470,465 B1 | * | 10/2002 | Shim et al. ................. | 714/718 |
| 6,542,973 B1 | * | 4/2003 | Hsu et al. ................... | 711/154 |
| 6,876,557 B1 | * | 4/2005 | Hsu et al. ..................... | 365/49 |
| 6,961,273 B1 | * | 11/2005 | Boldt et al. ................ | 365/201 |

* cited by examiner

*Primary Examiner*—David Ton
(74) *Attorney, Agent, or Firm*—Laurence A. Greenberg; Werner H. Stemer; Ralph E. Locher

(57) ABSTRACT

It is possible to read out data in accordance with a read-out address from memory cells via bit lines and primary sense amplifiers. Each secondary sense amplifier is assigned a group of primary sense amplifiers. It is possible for the primary sense amplifiers of a group to be connected to one of the secondary sense amplifiers in each case via switching devices in order to apply the datum from one of the primary sense amplifiers to the assigned secondary sense amplifier via the switching device selected by the read-out address. For reading out data, a test control unit is provided to connect some of the switching devices in parallel depending on a test mode signal and depending on a read-out address, so that in each case one of the group of primary sense amplifiers is connected to the assigned secondary sense amplifiers.

8 Claims, 4 Drawing Sheets

MEMORY CIRCUIT AND METHOD FOR READING OUT DATA

BACKGROUND OF THE INVENTION

Field of the Invention

The invention relates to a memory circuit having a memory cell array to be tested. The invention furthermore relates to a method for reading out data from a memory circuit, in particular, while testing the memory circuit.

Dynamic semiconductor memories have a memory cell array in which memory cells are addressable via word lines and bit lines. The memory cells essentially include a storage capacitor, which is connected to the respective bit line in a switchable manner through the activation of a word line, so that the charge of the capacitor is added to the corresponding bit line. The bit lines are organized in pairs. The activation of a word line results in only one storage capacitor being applied to one of the two lines of the bit line pair. This results in a charge difference between the bit lines of the bit line pair, which is amplified using a primary sense amplifier and made available to a secondary sense amplifier. In this case, a plurality of primary sense amplifiers form a group and are connected to the secondary sense amplifier in each case via a switching device. Depending on the read-out address present, one of the switching devices is activated in order to apply the datum read out from the respective primary sense amplifier to the secondary sense amplifier. The datum present at the secondary sense amplifier can then be accepted.

Semiconductor dynamic random access memories (DRAMs) have to be comprehensively tested in accordance with predetermined specifications after their production. In particular, a test is performed in accordance with a predetermined specification to check the time period between the application of the word line activation signal (the RAS signal) and the application of the bit line activation signal (the CAS signal), which connects the primary sense amplifier to the secondary sense amplifier. The RAS signal brings about activation of the respectively addressed word line, and the CAS signal effects the acceptance of the datum to be read out from the respective primary sense amplifier into the secondary sense amplifier.

The CAS signal serves for accepting the signal present at the input of the secondary sense amplifier. The timing TRCD (Timing RAS-CAS Delay) between the activation of the word line, after which the charge difference on the bit line pairs is amplified by the primary sense amplifiers, and the application of the amplified signal to the input of the secondary sense amplifier is critical and must correspond to the specification.

In order to test this timing parameter TRCD, it is necessary to check every possible address successively. In other words, the memory cells of the cell array have to be addressed with a burst length of "1" and a fast_X addressing pattern. This is a very slow way for testing the memory cell array with regard to the timing parameter TRCD. Depending on the specification of the DRAM memory to be tested, seven clock cycles are thus required for an address.

This has the disadvantage that all the addresses of the memory cell array have to be tested successively when testing the TRCD timing, with the result that a considerable test time is required for testing the specification of this parameter.

SUMMARY OF THE INVENTION

It is accordingly an object of the invention to provide a memory circuit and a method for reading out data from a memory circuit, which overcome the above-mentioned disadvantages of the prior art apparatus and methods of this general type.

In particular, it is an object of the present invention to provide a memory circuit in which the testing of the TRCD time parameter can be accelerated. It is also an object of the present invention to provide a method for reading out data from a memory circuit during the testing of the memory circuit, which method enables the testing of the memory circuit to be accelerated.

With the foregoing and other objects in view there is provided, in accordance with the invention, a memory circuit having a memory cell array to be tested. The memory cells in the memory cell array are addressed via word lines and bit lines. Data can be read out in accordance with a read-out address from the memory cells via bit lines and primary sense amplifiers. Secondary sense amplifiers are provided, and each secondary sense amplifier is assigned a group of primary sense amplifiers. The primary sense amplifiers of a group can be connected to one of the secondary sense amplifiers in each case via switching devices in order to apply the datum from one of the primary sense amplifiers to the assigned secondary sense amplifier via the switching device selected by the readout address. A test control unit is provided in order, for reading out data, to connect some of the switching devices in parallel depending on a test mode signal and depending on a read-out address, so that in each case one of the group of primary sense amplifiers is connected to the assigned secondary sense amplifier.

The invention makes use of the fact that generally when accepting the data present at their inputs, the secondary sense amplifiers can store the data and keep them ready for read-out. Thus, during the testing of the TRCD timing parameter, after test pattern data have been written to the memory circuit, a test mode signal is made available by the test control unit for the purpose of read-out, so that, in accordance with the address, a respective primary sense amplifier of each group of primary sense amplifiers is connected to the respective secondary sense amplifier. Consequently, after the acceptance of the data at the input of the secondary sense amplifier, e.g. by means of a sense signal at each secondary sense amplifier, data are available for read-out. If the bit lines, the primary sense amplifiers, the switching devices, and the secondary sense amplifiers are free of defects, and operate in accordance with the specification, then the test pattern data can be read out successively from the secondary sense amplifiers.

If the TRCD time lies above the required specification, then during the acceptance of the data into the secondary sense amplifiers, the primary sense amplifiers could not apply the respective datum to the input of the secondary sense amplifiers at the correct time or with sufficient strength. Consequently, there may be an erroneous datum in the respective secondary sense amplifier. The presence of an error in the TRCD timing is identified during the subsequent reading from the secondary sense amplifiers.

The memory circuit has the advantage over previous memory circuits that, during the testing of the TRCD timing, not every address has to be read out successively, but rather a plurality of addresses, in accordance with the number of secondary sense amplifiers present, is read out simultaneously into the secondary sense amplifiers. In this way, it is possible to accelerate the test method with regard to TRCD timing by a factor that corresponds to the number of secondary sense amplifiers present. This saves test time and thus costs.

It may be provided that the secondary sense amplifiers can be individually connected to a data bus in accordance with a read-out signal in order to read out the data successively via the data bus. In this case, the secondary sense amplifiers are preferably individually drivable or adjustable, so that the data can be applied successively to the data bus. This may be effected, for example, by an addressing signal provided by a bit line address decoder.

For accepting the data from the first sense amplifiers, the secondary sense amplifiers each have an activation input, to which preferably a sense signal is applied. The sense signal determines the point in time at which the data from the primary sense amplifiers are accepted.

With the foregoing and other objects in view there is provided, in accordance with the invention, a method for reading out data from a memory circuit, in particular during the testing of the memory circuit. In this case, the memory cells are addressable via word lines and bit lines, and data is read out in accordance with a read-out address from memory cells via bit lines and primary sense amplifiers. Each secondary sense amplifier is assigned a group of primary sense amplifiers. The primary sense amplifiers of a group are connected in a switchable manner to one of the secondary sense amplifiers in order to apply the datum from one of the primary sense amplifiers to the assigned secondary sense amplifier. Depending on a test mode signal and depending on the read-out address, data are simultaneously applied to the secondary sense amplifiers from a respective primary sense amplifier from the group of primary sense amplifiers.

The method enables faster testing of a memory circuit with regard to the TRCD timing parameter. To that end, when a test mode signal is present, unlike what has been customary hitherto, rather than only one primary sense amplifier being connected to the assigned secondary sense amplifier, a respective primary sense amplifier of a group is connected to the respectively assigned secondary sense amplifiers. In this way, given freedom from defects, there is not only one datum available for read-out, but rather data from a plurality of addresses of the memory circuit are available at the secondary sense amplifiers.

Other features which are considered as characteristic for the invention are set forth in the appended claims.

Although the invention is illustrated and described herein as embodied in a memory circuit and method for reading out data, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
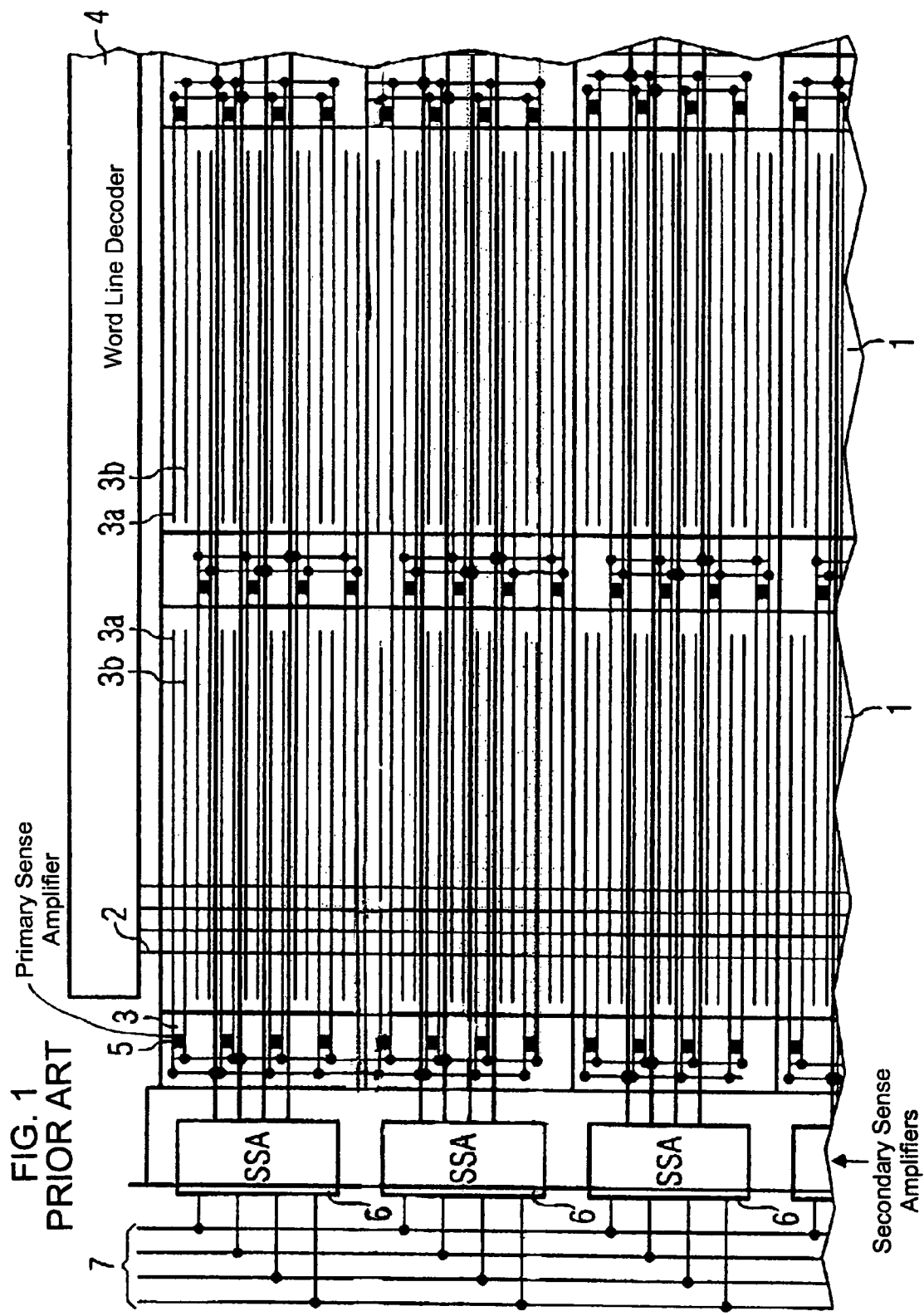
FIG. 1 is a schematic diagram of a prior art memory cell array.

Referring now to the figures of the drawing in detail and first, particularly, to FIG. 1 thereof, there is shown a detail from a prior art memory circuit. The memory circuit has two memory cell arrays 1 which are arranged next to one another and contain memory cells (not shown) which are addressable via word lines 2 and bit lines 3a, 3b. The word lines 2 are connected to a word line decoder 4 in order to activate one of the word lines 2 in accordance with a word line address. For the sake of better clarity, only four word lines 2 are illustrated, but there are more than four word lines, usually several 1000 word lines, present per memory cell array 1.

The bit lines 3a, 3b are organized in bit line pairs 3, and a primary sense amplifier is arranged at one end thereof.

If a word line 2 is activated, then the storage capacitors of the memory cells are connected to a respective one of the bit lines 3a, 3b of a bit line pair 3. A small charge difference in each case arises on the bit lines 3a, 3b of a bit line pair 3, which is amplified by the primary sense amplifiers 5. The polarity of the charge difference corresponds to the stored information of the memory cell.

The primary sense amplifiers 5 are arranged at both sides of the memory cell array 1 such that the primary sense amplifiers 5 for adjacent bit line pairs in each case lie at opposite sides of the respective memory cell array 1, i.e. every second bit line pair 3 is connected to primary sense amplifiers on one side. The primary sense amplifiers 5 lying between the two memory cell arrays 1 serve for the read-out of bit lines 3a, 3b in both memory cell arrays 1.

The memory circuit furthermore has secondary sense amplifiers 6 each assigned to a group of bit line pairs 3. The secondary sense amplifiers 6 amplify and store the datum read out from the primary sense amplifiers 5 and can be read via data lines 7. To that end, the bit lines 3a, 3b are connected to the associated secondary sense amplifiers 6 in each case via a switching device.

Figure 2:
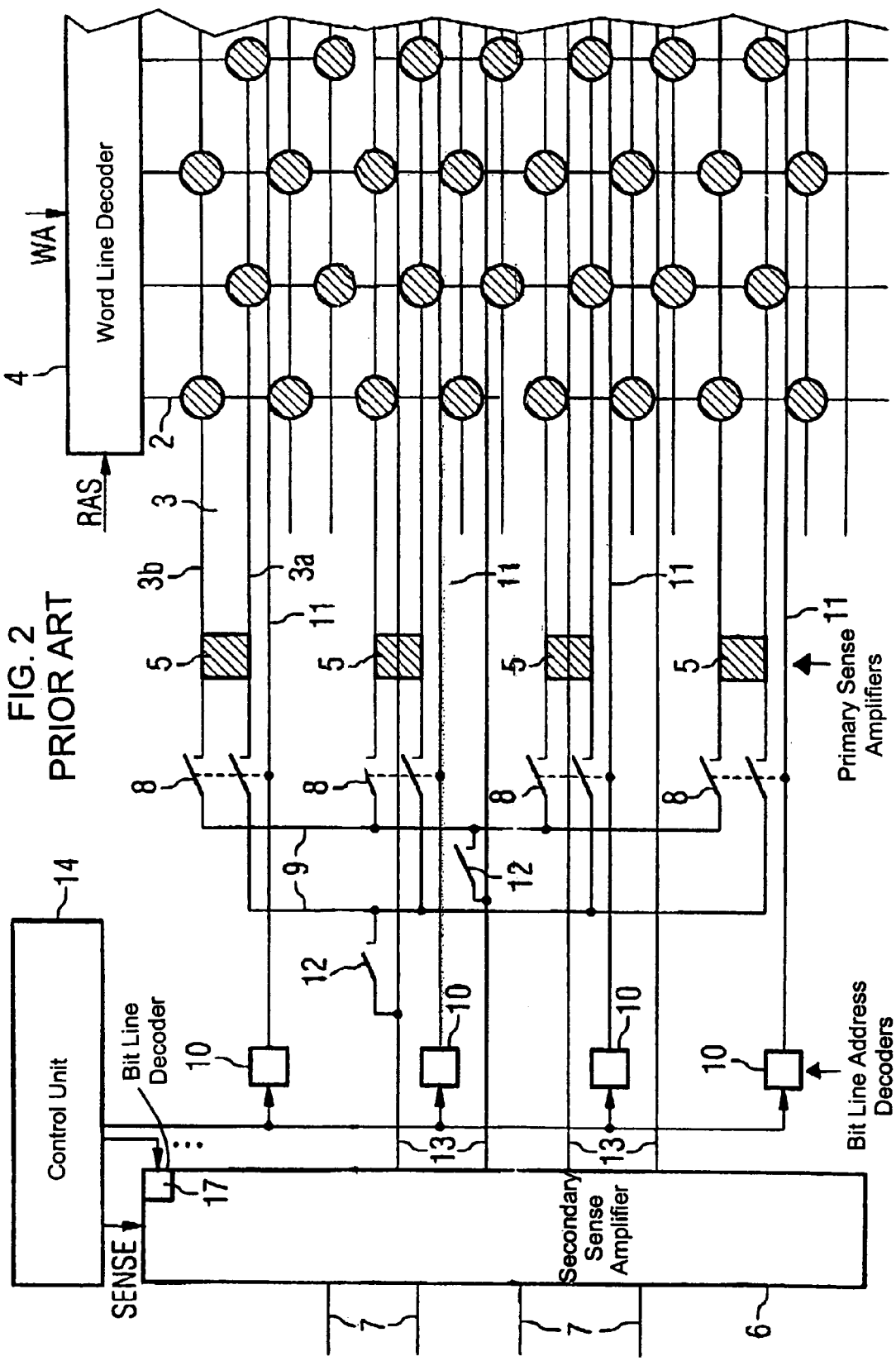
FIG. 2 is a detail from the memory cell array shown in FIG. 1.

The switching device for the read-out of data via a secondary sense amplifier 6 is illustrated in enlarged fashion in FIG. 2. For reasons of clarity, only the switching device on the left hand side of the left-hand memory cell array 1 of FIG. 1 is illustrated in FIG. 2. The primary sense amplifiers 5 are in each case connected to a switching device 8 in order, depending on a bit line address BA, to apply the amplified charge difference from the primary sense amplifier 5 to a read-out data line pair 9.

In order to drive the respective switching device 8, bit line address decoders 10 are provided, which generate a column select signal CSL depending on the applied bit line address BA. The column select signal CSL is then applied to the column select line 11 that is respectively connected to the bit line address decoder 10. The bit line address decoders 10 are connected to a control unit 14 in order to activate the bit line address decoders 10 in accordance with a bit line address such that one of the column select lines 11 closes one of the switching devices 8.

The secondary sense amplifier 6 serves for accepting the datum present on the read-out data line pair 9 and applying it to the data output lines. The acceptance of the data from the read-out data line pair 9 is effected using a sense signal generated by the control unit 14. The sense signal is essentially dependent on the bit line addressing signal (CAS signal) by means of which a valid bit line address is accepted and which determines the point in time at which the data from the bit line pairs 3 are to be accepted into the secondary sense amplifier 6.

The secondary sense amplifier 6 is configured such that it has a holding element (not shown) which stores the data accepted with the sense signal. The holding element stores the accepted datum for as long as the sense signal is active. At the same time, the sense signal stops the precharge operation.

The secondary sense amplifier 6 accepts the data from the read-out data line pair 9 via a master data line pair 13. Furthermore, the secondary sense amplifier 6 is connected to data output lines 7, to which the datum stored in the holding element of the secondary sense amplifiers 6 is output in a manner dependent on an addressing signal. The addressing signal is made available by a further bit line decoder 17 and causes the signal stored in the holding element of the secondary sense amplifier 6 to be output to the data output line 7.

The bit line address BA is preferably differentiated into a more significant part and a less significant part. The column select line 11 is selected with the more significant and the less significant part of the bit line address BA by using the bit line address decoder 10. The secondary sense amplifiers 6 are selected for read-out only with the more significant bit line addresses BA by the further bit line decoder 17.

The read-out data line pair 9 is connected to the master data line pair 13 in a switchable manner in each case via a segment switch 12. The segment switch 12 is driven by the more significant part of the word line address, which specifies that memory cell array of the memory cell arrays 1 from which the data are to be read out. The driving for the segment switch 12 is not illustrated for reasons of clarity. The illustration in FIG. 2 shows that only the upper master data line pair 13 is connected to the read-out data line pair 9 via segment switches 12. The lower master data line pair 13 is connected via further segment switches to a further read-out data line pair of the further memory cell array 1 shown in FIG. 1.

Only a left-hand part of a memory cell array 1 is illustrated for reasons of clarity. A comparable arrangement is provided at the right-hand edge of the memory cell 1 illustrated, i.e. every second bit line pair is connected to a further primary sense amplifier at the right-hand edge, which is connected to a further read-out data line pair in a switchable manner via further switching devices. The further read-out data line pair can be connected to the lower master data line pair 13 via segment switches.

The word line address decoder 4 has an RAS input for an RAS signal and a word line address input for a word line address WA. When reading out the content of a memory cell, first a word line address WA is applied to the word line address decoder 4 and is decoded, and the corresponding word line 2 is activated subsequently or simultaneously using the RAS signal. As a result, all of the memory transistors on the activated word line are activated and the storage capacitors of the memory cells situated on the word line are applied to a respective one of the bit lines 3*a*, 3*b* of the corresponding bit line pairs 3. The resulting charge difference on the bit line pairs 3 is amplified by the primary sense amplifiers 5. The amplified voltage difference is then present at the switching devices 8.

The bit line address BA determines which of the column select lines 11 is activated. The activated column select signal CSL on the column select lines 11 activates the switching device 8 driven by the relevant column select line 11, so that the voltage difference is applied to the read-out data line pair 9. Since the column select lines 11 essentially extend over a plurality or all of the memory cell arrays 1, a datum is thus present on the addressed read-out data line pairs 9 of each memory cell array 1. In order to read out only the addressed datum, the corresponding memory cell array 1 is selected using a more significant part of the word line addressed WA and the segment switches 12, and the datum on the corresponding readout data line pair 9 is applied to the master data line pair 13.

During the testing of the TRCD timing parameter, a check is made to determine whether the read-out of each memory cell can be effected within a specific time prescribed by the specification, i.e. whether the time from the addressing of the memory cell using the RAS signal until the error-free read-out of the data stored therein into the secondary sense amplifier 6 remains within the required specification. This time is determined by the time period between the application of the RAS signal and the application of the CAS signal during which the data can be read out without any errors.

Through the activation of the RAS signal, the addressed word line is activated, and the charges from the connected storage capacitors of the memory cells are applied to one of the bit lines of the bit line pairs 3 and are amplified by the primary sense amplifier 5. The CAS signal activates the bit line address BA, so that the switching device 8 selected by the bit line address BA is turned on, so that the corresponding data signal is present on the read-out data line pairs 9 and thus via the addressed segment switches 12 at the inputs of the addressed secondary sense amplifiers 6. If the switching device 8 is activated too early, then the amplification of the charge difference by the primary sense amplifier 5 is disturbed on account of the greatly increased line capacitance, so that either no amplification or erroneous amplification is effected.

During the testing of such a memory circuit, each address has to be tested with regard to the TRCD timing parameter, so that, after the read-out of an address, it is necessary first to carry out a charge equalization between the bit lines 3*a*, 3*b* of a bit line pair 3 before the next read-out operation can begin. Afterward, the address is incremented and the next address is tested with regard to the TRCD timing. Data have previously been written to the memory circuit, so that, during the read-out of successive addresses, it is necessary each time to toggle the voltage difference on the data path, i.e. on the read-out data line pair 9 and on the master data line per 13, so that each line of the data line pairs experiences a charge reversal from a high to low or low to high level.

Figure 3:
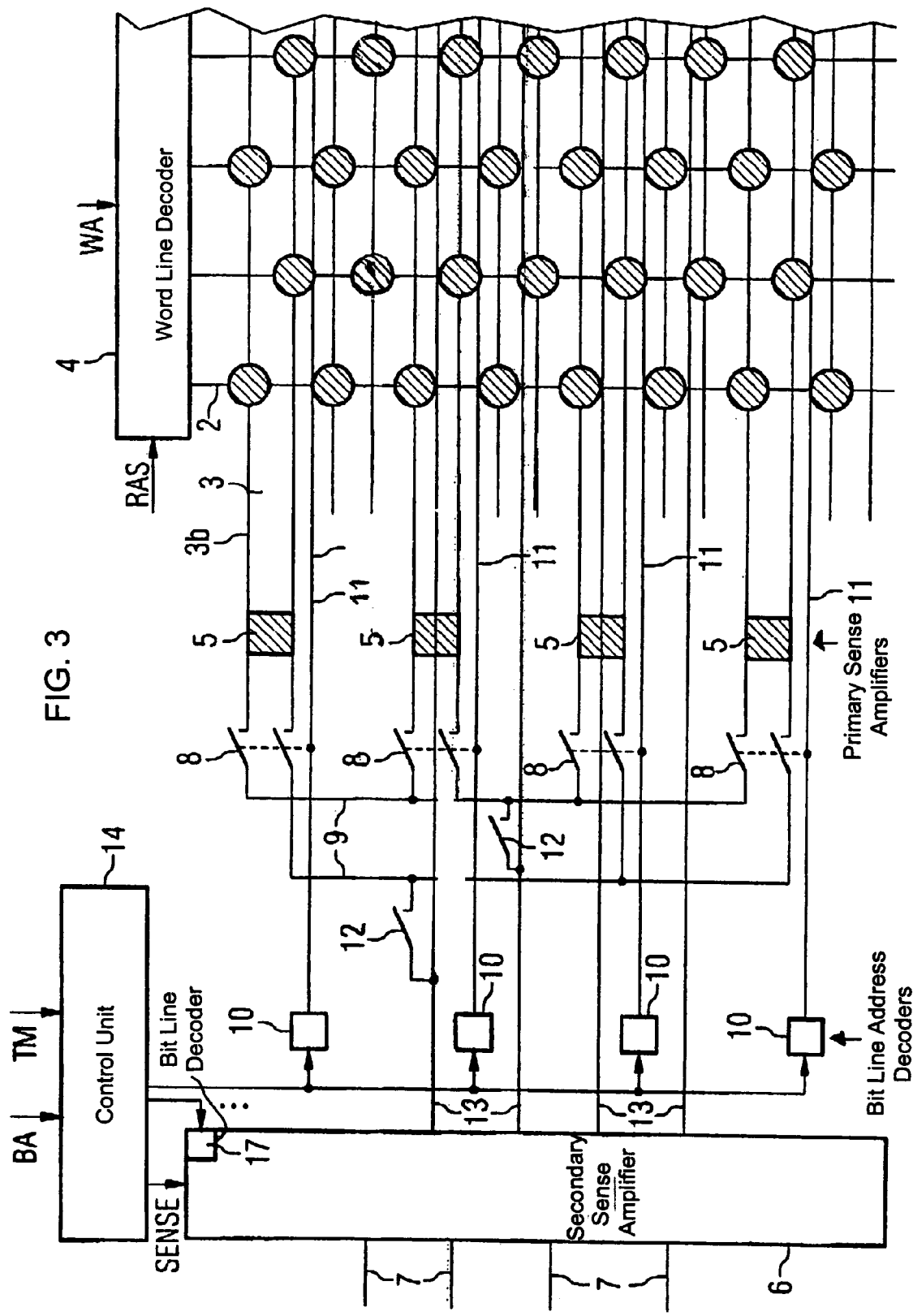
FIG. 3 is a detail from an embodiment of an inventive memory circuit.

FIG. 3 illustrates a detail from a preferred embodiment of an inventive memory circuit. The inventive memory circuit essentially differs from the previously known memory circuits by the fact that the control unit 14 has a test input for a test mode signal TM.

The control unit 14 serves for driving the bit line address decoders 10 and the further bit line address decoder 17, which are each assigned to a secondary sense amplifier 6, in accordance with a bit line address BA. The bit line address BA may also already be partly decoded in the control unit 14. If a test mode is indicated by the test mode signal TM, then the more significant bit line address bits, which are responsible for the selection of the bit line group assigned to a secondary sense amplifier 6, are interrupted and set hard to valid. Which is thereby achieved is that, for each secondary sense amplifier 8, one of the switching devices switches and connects one of the bit line pairs 3 in each case to one of the secondary sense amplifiers 6.

Furthermore, the test mode signal TM has the effect that the sense signal is present at the secondary sense amplifiers 6 until each of the secondary sense amplifiers 6 has been read successively via the data output line 7. This is illustrated in the comparison in FIG. 4a and FIG. 4b.

Figure 4A:
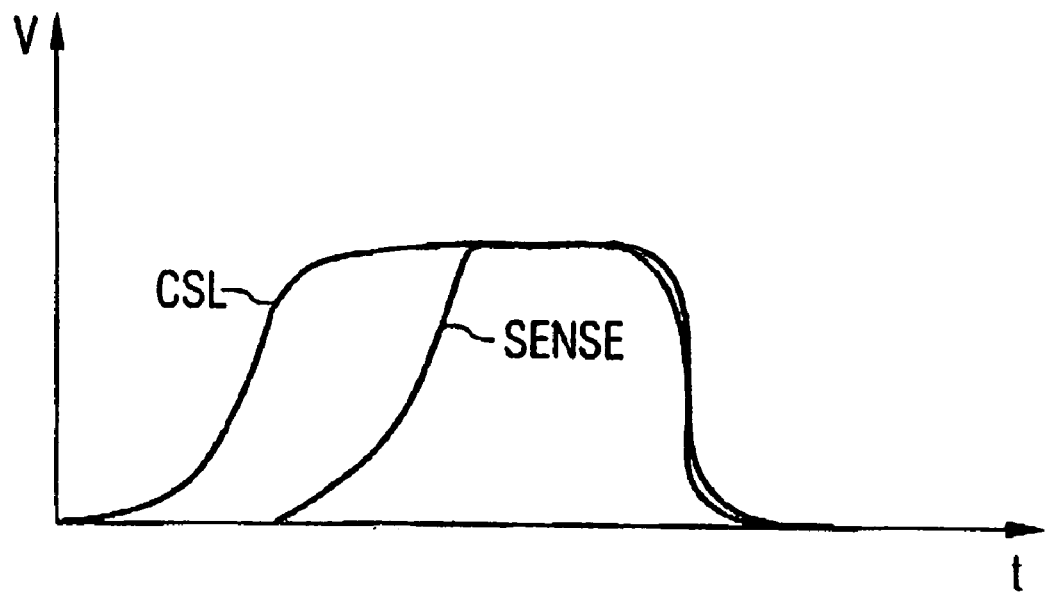
FIGS. 4a, 4b are graphs showing signal profiles for the column select signal CSL and the sense signal SENSE.
Figure 4B:
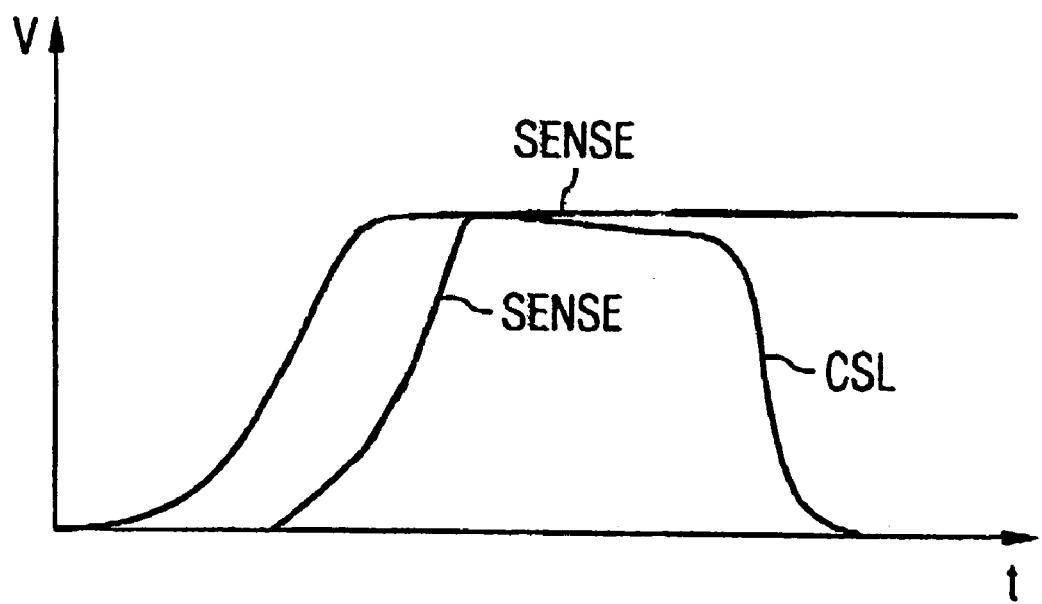

FIG. 4a shows the signal profiles of the column select signal CSL and of the sense signal SENSE. The column select signal CSL is activated at a specific time and the sense signal SENSE is activated after a further time duration has passed, in order to accept the data present at the master data line pair 13 into the secondary sense amplifier 6. The two signals are reset and thus both the switching device 8 and the segment switches 12 are opened if the datum to be read out has been read out from the secondary sense amplifier 6 via the data output lines.

If the test mode signal is present, then the sense signal SENSE is held in the active state longer, namely until all the secondary sense amplifiers 6 to be read or the holding elements thereof have been read successively.

The test mode signal TM is activated if the intension is to carry out a read-out in a TRCD timing test operation. The test mode signal TM has the effect that, in each bit line address decoder 10, the more significant bits of the bit line address are masked, i.e. ignored, so that, in each group of bit line pairs 3 assigned to a secondary sense amplifier 6, a datum is switched through from a respective one of the bit line pairs of the group via the switching device 8, activated by the respective bit line address decoder 10, to the read-out data line pair 9 and via the segment switches 12 to the corresponding master data line pair 13. Using the sense signal SENSE, which is made available to each of the secondary sense amplifiers 6 by the control unit 14, the data respectively present at all of the secondary sense amplifiers 6 via the master data line pair 13 are simultaneously accepted into the secondary sense amplifiers 6.

In order that the secondary sense amplifiers 6 do not simultaneously drive the read-out data onto the data output line pairs 7, the secondary sense amplifiers 6 are addressed via the further bit line decoders 17, so that data can be read out from the secondary sense amplifiers 6 serially under the control of the control unit 14. This may be effected, for example, by blocking the more significant part of the bit line address BA and counting up the bit line address BA by successive incrementing, so that the individual secondary sense amplifiers 6 are addressed successively.

The bit line address decoders 10 connected to the column select lines 11 are driven by the bit line address BA present during normal operation. If the test mode signal TM is activated, then the more significant bit line address bits which are responsible for the selection of the bit line group assigned to a secondary sense amplifier 6 are interrupted and set hard to "valid". As a result, a column select line 11 selected by the less significant bit line address bits becomes active in each group. Consequently, a datum is read out in parallel in all the groups of bit lines 3a, 3b. The test mode signal TM has the effect that the sense signal SENSE remains applied to each of the secondary sense amplifiers 6 until all the data stored in the secondary sense amplifiers 6 have been read out. In addition, the bit line address decoders 10 are inhibited so long for all further activations by the control unit 14.

The test time gain can be estimated as follows: Assuming 16 groups of bit lines each connected to a secondary sense amplifier 6, the TRCD test for a respective address requires 7 clock cycles per memory cell array 1. This corresponds to 16×7=112 clock cycles. The 7 clock cycles are only required once with the memory circuit according to the invention. The further read-out can then be performed with one address per clock cycle. This corresponds to 16+7=23 clock cycles.

As the storage density increases, the number of groups and memory cell arrays increases, but the storage capacitance remains the same. Consequently, the time for the TRCD test can be shortened ever further as a percentage.

I claim:

1. A memory circuit, comprising:
   a memory cell array including a plurality of memory cells, a plurality of word lines, and a plurality of bit lines, said plurality of memory cells being addressable via said plurality of word lines and bit lines;
   a plurality of primary sense amplifiers for reading out, via said plurality of bit lines, data from said plurality of memory cells in accordance with a read-out address;
   a plurality of secondary sense amplifiers, each of said plurality of secondary sense amplifiers including a latch;
   a plurality of switching devices, a group of said plurality of primary sense amplifiers being connected to an assigned one of said plurality of said secondary sense amplifiers via a group of said plurality of switching devices for applying a datum from one of said plurality of primary sense amplifiers of said group to said assigned one of said plurality of secondary sense amplifiers via one of said plurality of switching devices selected by a read-out address; and
   a test control unit configured for reading out data by connecting some of said plurality of switching devices in parallel depending on a test mode signal and depending on the read-out address, so that in each case, one of said group of primary sense amplifiers is connected to said assigned one of said plurality of secondary sense amplifiers.

2. The memory circuit according to claim 1, further comprising:
   a data bus;
   said plurality of secondary sense amplifiers being individually connected to said data bus in accordance with a read-out signal for successively reading out data via said data bus.

3. The memory circuit according to claim 1, wherein each of said plurality of secondary sense amplifiers has an activation input for accepting data from a respective one of said plurality of primary sense amplifiers in accordance with an activation signal.

4. The memory circuit according to claim 1, further comprising:
   an address decoder for selecting at least one of said plurality of said switching devices in accordance with an address;
   said address decoder connected to at least one of said plurality of switching devices.

5. The memory circuit according to claim 4, wherein:
   said address decoder has an input for obtaining the test mode signal; and
   depending on the test mode signal, only a part of an address, which is applied to said address decoder, is taken into account for selecting one of said plurality of switching devices.

6. The memory circuit according to claim 5, wherein:
   the address, which is applied to said address decoder, includes more significant address bits and less significant address bits; and
   the part of the address, which is applied to said address decoder, that is taken into account corresponds to the less significant address bits.

7. A method for reading out data from a memory circuit while testing the memory circuit, which comprises:
  providing a memory cell array including a plurality of memory cells, a plurality of word lines, and a plurality of bit lines, the plurality of memory cells being addressable via the plurality of word lines and bit lines;
  using a plurality of primary sense amplifiers to read out, via the plurality of bit lines, data from the plurality of memory cells in accordance with a read-out address;
  assigning each one of a plurality of secondary sense amplifiers to a respective group of the plurality of primary sense amplifiers;
  switchably connecting a group of the plurality of primary sense amplifiers to an assigned one of the plurality of the secondary sense amplifiers to apply a datum from one of the plurality of primary sense amplifiers to the assigned one of the plurality of secondary sense amplifiers; and
  depending on a test mode signal and depending on the read-out address, simultaneously applying data to a secondary sense amplifier from a respective primary sense amplifier of the group of the plurality of primary sense amplifiers.

8. The method according to claim 7, which further comprises successively reading out the data from the plurality of secondary sense amplifiers.

* * * * *